(12) United States Patent
Hwang et al.

(10) Patent No.: US 9,840,064 B2
(45) Date of Patent: Dec. 12, 2017

(54) DECORATIVE TAPE, METHOD OF MANUFACTURING THE SAME, AND DECORATIVE COVER INCLUDING THE SAME

(71) Applicant: 3M INNOVATIVE PROPERTIES COMPANY, St. Paul, MN (US)

(72) Inventors: Joonsik Hwang, Gyeonggi-do (KR); Hanbyol Shim, Gyeonggi-do (KR)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/786,582

(22) PCT Filed: Apr. 18, 2014

(86) PCT No.: PCT/US2014/034612
§ 371 (c)(1),
(2) Date: Oct. 23, 2015

(87) PCT Pub. No.: WO2014/176123
PCT Pub. Date: Oct. 30, 2014

(65) Prior Publication Data
US 2016/0067944 A1   Mar. 10, 2016

(30) Foreign Application Priority Data
Apr. 23, 2013  (KR) .................. 10-2013-0045020

(51) Int. Cl.
*B32B 7/02*   (2006.01)
*C23C 16/06*   (2006.01)
(Continued)

(52) U.S. Cl.
CPC ................ *B32B 7/02* (2013.01); *B32B 27/36* (2013.01); *C23C 16/06* (2013.01); *B32B 37/24* (2013.01);
(Continued)

(58) Field of Classification Search
CPC ....... B32B 27/36; B32B 7/02; B32B 2405/00; B32B 37/24; B32B 2311/22;
(Continued)

(56) References Cited

U.S. PATENT DOCUMENTS 3,909,328 A   9/1975  Dessauer et al.
4,018,640 A   4/1977  Amberg
(Continued)

FOREIGN PATENT DOCUMENTS

KR   10-2008-0024351   3/2008

OTHER PUBLICATIONS

PCT International Search Report from PCT/US2014/034612 dated Aug. 27, 2014, 3 pages.

*Primary Examiner* — Patricia L Nordmeyer
(74) *Attorney, Agent, or Firm* — Steven A. Bern; Dena M. Ehrich

(57) ABSTRACT

Disclosed are a decorative tape including a printing layer, a base film layer on the printing layer, a nickel deposited layer on the base film layer and a pressure-sensitive adhesive layer on the nickel deposited layer; a method of manufacturing the decorative tape; and a decorative cover using the decorative tape.

10 Claims, 5 Drawing Sheets

(51) Int. Cl.
*B32B 27/36* (2006.01)
*B32B 37/24* (2006.01)

(52) U.S. Cl.
CPC ..... *B32B 2255/10* (2013.01); *B32B 2255/205* (2013.01); *B32B 2255/28* (2013.01); *B32B 2311/22* (2013.01); *B32B 2315/08* (2013.01); *B32B 2405/00* (2013.01); *B32B 2451/00* (2013.01); *B32B 2509/00* (2013.01); *B32B 2509/10* (2013.01)

(58) Field of Classification Search
CPC ............ B32B 2315/08; B32B 2509/00; B32B 2509/10; B32B 2255/205; B32B 2451/00; B32B 2255/28; B32B 2255/10; C23C 16/06
See application file for complete search history.

(56) References Cited

U.S. PATENT DOCUMENTS

| | | | |
|---|---|---|---|
| 4,101,698 A * | 7/1978 | Dunning | B29C 45/14811 156/230 |
| 4,173,672 A | 11/1979 | Mannheim | |
| 4,520,053 A | 5/1985 | Marentic | |
| 5,079,058 A | 1/1992 | Tomiyama et al. | |
| 5,085,907 A * | 2/1992 | Smith | B32B 7/02 428/345 |
| 5,135,797 A | 8/1992 | Sasaki | |
| 5,773,112 A | 6/1998 | Tachikawa et al. | |
| 6,568,817 B1 | 5/2003 | Mimura et al. | |
| 6,953,618 B2 * | 10/2005 | Enniss | B32B 17/10018 156/297 |
| 7,121,197 B2 * | 10/2006 | Geddes | B41M 3/12 101/34 |
| 8,252,401 B2 * | 8/2012 | Beppu | B32B 27/08 428/141 |
| 2008/0311369 A1 | 12/2008 | Yokoyama et al. | |
| 2010/0136276 A1 * | 6/2010 | Andou | B32B 27/08 428/41.8 |
| 2011/0244158 A1 * | 10/2011 | Murakami | B32B 7/12 428/35.8 |
| 2014/0352685 A1 * | 12/2014 | Gee | B32B 7/12 126/714 |

* cited by examiner

DECORATIVE TAPE, METHOD OF MANUFACTURING THE SAME, AND DECORATIVE COVER INCLUDING THE SAME

TECHNICAL FIELD

The present disclosure relates to a decorative tape, a method of manufacturing the decorative tape, and a decorative cover including the decorative tape. More particularly, the present disclosure relates to a decorative tape attached to exteriors of home appliances, such as a refrigerator and an air conditioner, a method of manufacturing the decorative tape, and a decorative cover including the decorative tape.

BACKGROUND

With consumer tastes rising, products with luxurious exteriors have recently appeared in the home appliance business field, which relates to a refrigerator, a Kimchi refrigerator, an air conditioner, and the like. The luxurious exterior not only provides a product with an additional value, but also makes a product distinguishable. For this, a combination of a metal deposition and a printing technology such as a screen printing and a spray coating, and the like has been introduced. By using these combined technologies, a distinguished and luxurious design has been provided.

In previous approaches, in order to provide a product a luxurious design with a product, a glass is directly coated, and then, the coated glass is attached to home appliances, such as a refrigerator. As illustrated in FIG. 1, in previous approaches, a decorative cover attached to the home appliances has a structure in which a Ni deposition layer is laminated on a glass substrate, a printing layer is laminated on the Ni deposition layer, and a poly(vinyl chloride) (PVC) black sheet is laminated on the printing layer.

Such decorative cover is manufactured by a process illustrated in FIG. 2. Specifically, nickel is directly deposited on glass or a substrate under a vacuum condition specialized to a deposition process (a nickel deposition process). The nickel deposition process is performed by a nickel deposition company. Then, the nickel deposited glass or substrate is moved to a printing company to be printed in a specific color (a printing process). Next, the printed product is moved to a sheet company and on the printing layer, a PVC black sheet is laminated. The black sheet prevents discoloration during a manufacturing process, prevents corrosion of several layers caused by gas generated during a polyurethane foaming process, and makes a final color darker.

In the conventional decorative cover, Ni needs to be directly deposited on the glass substrate and the printing needs to be directly performed thereon. This is a very complex technology that may result in a low yield. Since the decorative cover has been supplied through complex steps as illustrated in FIG. 2, it is also difficult to control a product manufacturing process. The decorative cover passes through several steps, such as a supply process and a delivery process, so that there is a concern about damage of a material during the processes.

U.S. Pat. No. 6,568,817 discloses a reflective sheet having a printed layer. The reflective sheet includes a reflective element, a body layer and a surface protective layer, and has a structure in which the reflective element is interposed between the body layer and the surface protective layer.

RELATED ART

Patent Document

U.S. Pat. No. 6,568,817

Problems to be Solved

The object of the present disclosure is to provide a decorative tape having excellent adhesive force to glass or a substrate, good productivity, and a convenient work processability, without possibility of damage of a material, by solving the problems of previous approaches; a method of manufacturing the decorative tape; and a decorative cover including the decorative tape.

Means to Solve the Problem

In order to achieve the object of the present disclosure as described above, the disclosure provides a decorative tape including: a printing layer; a base film layer on the printing layer; a nickel deposited layer on the base film layer; and a pressure-sensitive adhesive layer on the nickel deposited layer.

The present disclosure also provides a decorative tape including: a printing layer; a primer layer on the printing layer; a base film layer on the primer layer; a hard coating layer on the base film layer; a nickel deposited layer on the hard coating layer; and a pressure-sensitive adhesive layer on the nickel deposited layer.

The present disclosure also provides a decorative tape including: a printing layer; a first hard coating layer on the printing layer; a base film layer on the first hard coating layer; a second hard coating layer on the base film layer; a nickel deposited layer on the second hard coating layer; and a pressure-sensitive adhesive layer on the nickel deposited layer.

The present disclosure also provides a decorative cover in which one of the decorative tapes is attached on a transparent base; and an electrical apparatus in which the decorative cover is used.

The present disclosure also provides a method of manufacturing a decorative tape, the method including: depositing nickel on a base film; performing a coloring coating on backside of the base film; and laminating a pressure-sensitive adhesive on the nickel deposited surface.

The present disclosure also provides a method of manufacturing a decorative tape, the method including: forming a hard coating layer on a base film; depositing nickel on the hard coating layer; forming a primer layer on a backside of the base film; performing a coloring coating on the primer layer; and laminating a pressure-sensitive adhesive on the nickel deposited surface.

The present disclosure also provides a method of manufacturing a decorative tape, the method including: forming a second hard coating layer on a base film; depositing nickel on the second hard coating layer; forming a first hard coating layer on a backside of the base film; performing a coloring coating on the first hard coating layer; and laminating a pressure-sensitive adhesive on the nickel deposited surface.

Effect of Invention

According to the present disclosure, a novel decorative tape is provided, which can be supplied in a form of a roll-type sheet, so that it is very convenient to handle the decorative tape. There is no concern that the material of the decorative tape will be damaged during a manufacturing process, and the decorative tape can be conveniently treated in one process and has excellent productivity.

DETAILED DESCRIPTION OF THE INVENTION

Hereinafter, a decorative tape according to the present disclosure will be described in detail with reference to the accompanying drawings.

Figure 3:
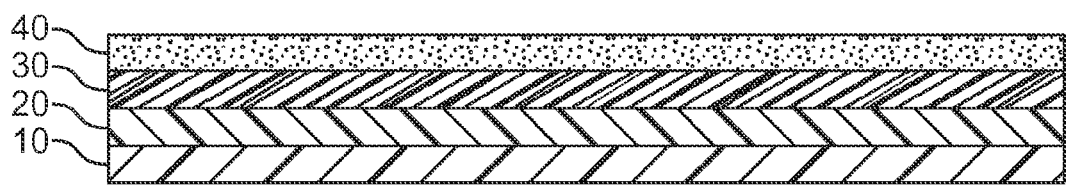
FIG. 3 is a cross-sectional view of a decorative tape according to an exemplary embodiment of the present disclosure.

FIG. 3 is a cross-sectional view of a decorative tape according to an exemplary embodiment of the present disclosure. The decorative tape includes a printing layer 10, a base film layer 20 on the printing layer 10, a nickel deposited layer 30 on the base film layer 20, and a pressure-sensitive adhesive layer 40 on the nickel deposited layer 30.

The decorative tape according to the exemplary embodiment of the present disclosure is characterized in that a printing technique, a Ni deposition technique and a pressure-sensitive adhesion technique are all combined. In previous approaches, a process which a combined a printing technique and Ni deposition technique was employed. However, previous approaches use a method of performing direct coating on a substrate, not using an adhesive tape, which is different from the present disclosure.

Here, on the printing layer 10, a color(s) such as a red color, a white color and a black color, and the like, may be printed by selection of a demander. A printing method may include a screen printing, a spray coating, and the like.

The base film layer 20 is not particularly limited, but may be formed of a polyester film. Here, preferably, the polyester may be polyethylene terephthalate (PET).

The nickel deposited layer 30 is formed on the polyester film, and exhibits the mirror reflection effect, which means it exhibits the effect of reflecting an image on an opposite surface of a substrate 100, such as glass.

The nickel deposited base film shows a mirror reflection effect. Especially, the nickel deposited layer 30 formed on the polyester base film exhibits the mirror reflection effect, to show an image on the opposite surface of the glass. Reflectivity may be adjusted according to a quantity of nickel deposition. The reflectivity of the basic nickel deposited film without printing layer 10 and adhesive layer is in a range of 20 to 60%.

The pressure-sensitive adhesive layer 40 may be formed of a solvent based adhesive, for example, a solvent based transparent pressure-sensitive adhesive. The solvent based adhesive, which is an adhesive fluidized by dissolving a polymer in a solvent, is solidified by volatilization of the solvent to form an adhesive layer. The pressure-sensitive adhesive layer 40 is provided by either lamination of the adhesive layer to the nickel deposition film or by coating the adhesive solvent solution onto the nickel deposition film followed by volatization of the solvent. The result is an adhesive layer that has excellent adhesive force to the substrate, such as glass. By means of the pressure-sensitive adhesive layer, the decorative tape including the printing layer 10, the base film layer 20, and the nickel deposited layer 30 is well attached to the substrate, such as glass, so that the decorative cover may be formed. In some embodiments the pressure-sensitive adhesive layer 40 may have a thickness in a range of 10 to 50 micrometers (μm), and in other embodiments it may have a thickness in a range of 15 to 30 μm. Even if the same adhesive is used, an exterior of the decorative tape may be changed according to a thickness of the adhesive. The decorative tape according to the present disclosure is manufactured in one process, and thus it is not necessary to consider reworkability in selecting the pressure-sensitive adhesive layer 40.

The most crucial property of the adhesive is to have appearance like an optically transparent adhesive. However, transmittance of the adhesive is less crucial than that of a general optically transparent adhesive. The adhesive is not particularly limited, and as an example the pressure-sensitive adhesive may be a known existing acrylic type adhesive. However, it is prohibited to add an adhesive tackifier to the adhesive. The reason is that sulfurization may be generated under a condition of ultraviolet rays. Specific examples of acrylate adhesives may include 2-ethylhexylacrylate, butylacrylate and isooctylacrylate. The acrylates may be used either alone or in a mixture of two more. Some adhesives use a mixture of 2-ethylhexylacrylate and butylacrylate, to which acrylic acid may be added.

The pressure-sensitive adhesive layer 40 may additionally include a releasing film layer 50 thereon. The releasing film layer 50 is used in order to protect an adhesive surface of the pressure-sensitive adhesive layer 40 in a process of manufacturing or handling the decorative tape or the decorative cover. Preferably, the releasing film layer 50 may be formed of a polyester film. Here, preferably, the polyester is PET.

Figure 4:
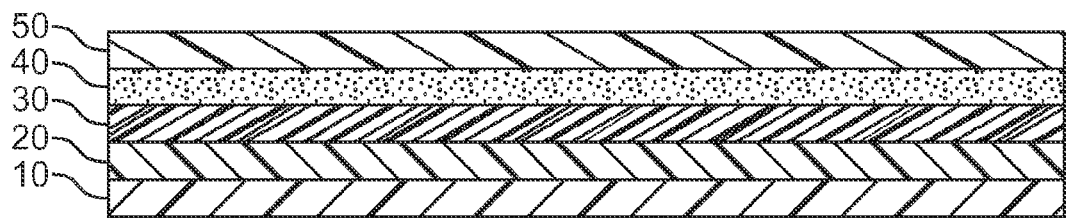
FIG. 4 is a cross-sectional view of a decorative tape including a releasing film formed on a tape of FIG. 3.

FIG. 4 is a cross-sectional view of the decorative tape including the releasing film 50 formed on the tape of FIG. 3. The releasing film 50 is peeled off in advance when attached to the substrate.

A method of manufacturing a decorative tape according to an exemplary embodiment of the present disclosure includes depositing nickel on the base film 10, performing a coloring coating 30 on backside of the base film 10, and laminating the pressure-sensitive adhesive layer 40 on the nickel deposited surface 20.

Figure 1:
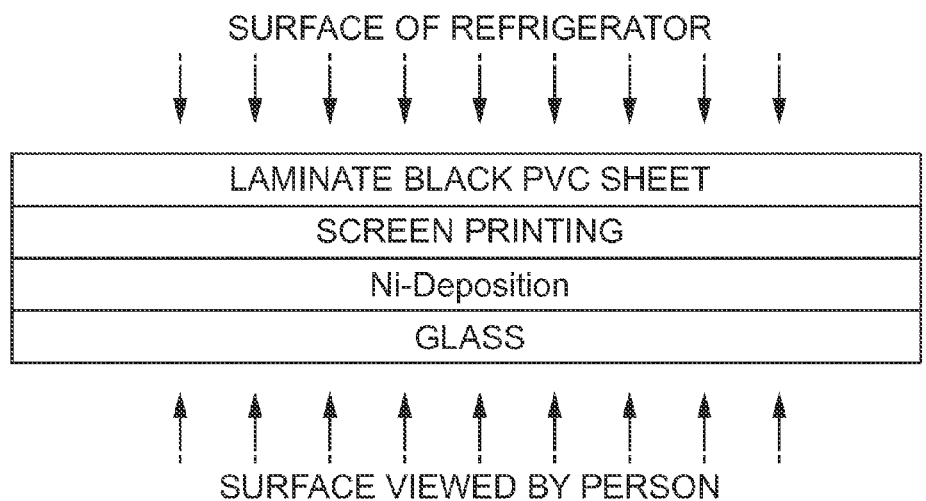
FIG. 1 illustrates a structure of a decorative cover in prior art.
Figure 2:
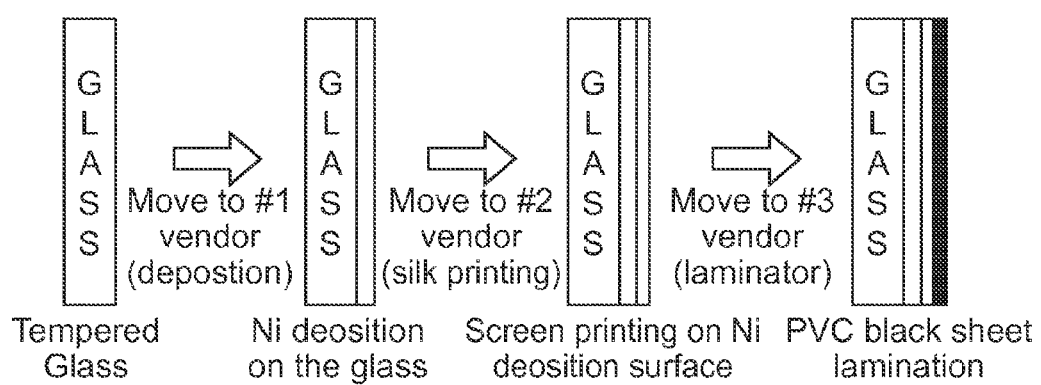
FIG. 2 illustrates a process of manufacturing a decorative cover in prior art.

As illustrated in FIG. 2, in previous approaches, home appliances are decorated by a process of directly depositing nickel that is the material of the decorative tape on the transparent substrate and directly performing the screen printing on the nickel deposited surface. Accordingly, in such approaches, it is difficult to directly deposit the nickel on the transparent substrate. However, the present disclosure may solve the aforementioned difficulty by depositing the nickel on the base film, instead of directly depositing the nickel on the transparent substrate. In previous approaches, screen printing is directly performed on the nickel deposited surface, and thus which makes is more difficult. However, the present disclosure may solve such difficulty by performing a printing on the base film.

In previous approaches, since the process of depositing the nickel on the transparent substrate and the process of performing printing on the nickel deposited surface need to be separately performed, and thus, the process itself is troublesome. However, in the present disclosure, the process of depositing the nickel on the base film and the process of performing printing on the backside of the base film may be performed in one process for manufacturing the tape, the process itself is simplified and convenient. Since the processes are not separately performed, there is no concern of damage of a material that may be generated in a process of delivery. The coloring coating process may be performed by a spray coating method.

A tape product according to the present disclosure may be supplied in a roll type, and thus, workability may be significantly improved. To this end, all of the nickel deposition and the printing operation may be performed in a roll-to-roll type equipment.

Figure 5:
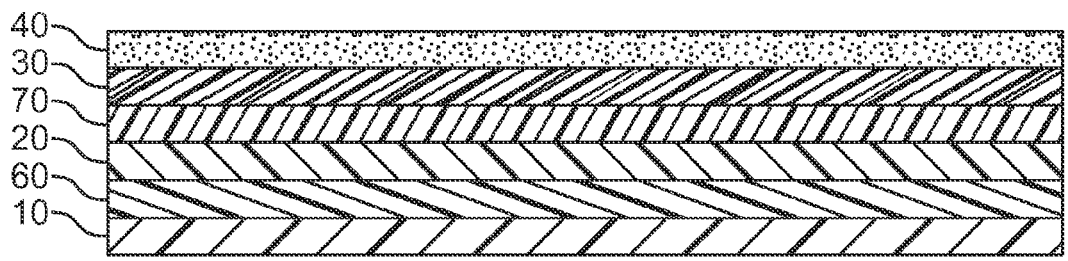
FIG. 5 is a cross-sectional view of a decorative tape according to another exemplary embodiment of the present disclosure.

FIG. 5 illustrates a decorative tape according to another exemplary embodiment of the present disclosure. The decorative tape includes a printing layer 10, a primer layer 60 on the printing layer 10, a base film layer on the primer layer 60, a hard coating layer 70 on the base film layer 20, a nickel deposited layer 30 on the hard coating layer 70 and a pressure-sensitive adhesive layer 40 on the nickel deposited layer 30.

In the decorative tape, a primer treatment and a hard coating are simultaneously performed.

The primer layer 60 has high transparency and also improves printability. The primer is processed on the polyester film in order to improve adhesive force with ink or an adhesive. The primer is processed on an optical film, to prevent scratches. The primer layer serves as a lubricant so that the decorative tape smoothly operates when the decorative tape itself is rolled or un-rolled.

A hard coating on the hard coating layer 70 represents a deposition for strengthen a mechanical property of a film by heat treatment. A thin film formed by the deposition is soft and has a weak mechanical property in general. However, if the thin film is subjected to the heat treatment, the film becomes harder and stronger in mechanical property. The hard coating layer 70 having pencil hardness of 3 H or higher may be used.

The 3 H hard coating layer 70 provides an effect of protecting the tape from scratches, and the like, without haze. The 3 H hard coating layer 70 also gives an effect of preventing the tape from being opaque and is used for improving printing.

Figure 6:
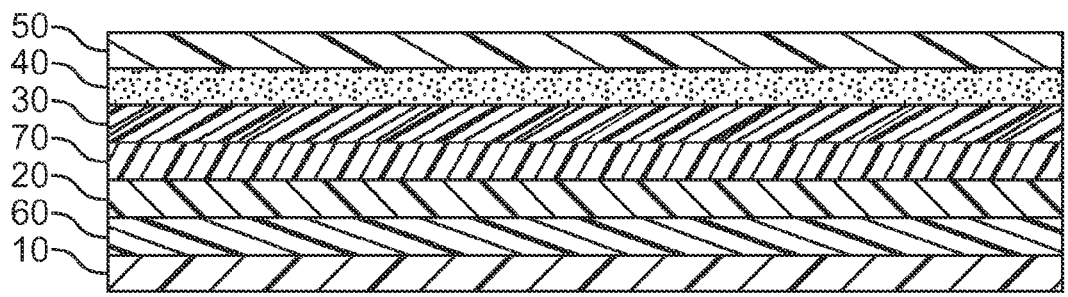
FIG. 6 is a cross-sectional view of a decorative tape including a releasing film formed on the tape of FIG. 5.

FIG. 6 is a cross-sectional view of the decorative tape including a releasing film 50 formed on the tape of FIG. 5. The releasing film 50 is peeled off in advance when attached to the substrate.

A method of manufacturing the decorative tape includes forming a hard coating layer on a base film, depositing nickel on the hard coating layer, forming a primer layer on an opposite surface of the hard coating layer formed surface of the base film, performing a coloring coating on the primer layer, and laminating a pressure-sensitive adhesive on the nickel deposited surface.

Figure 7:
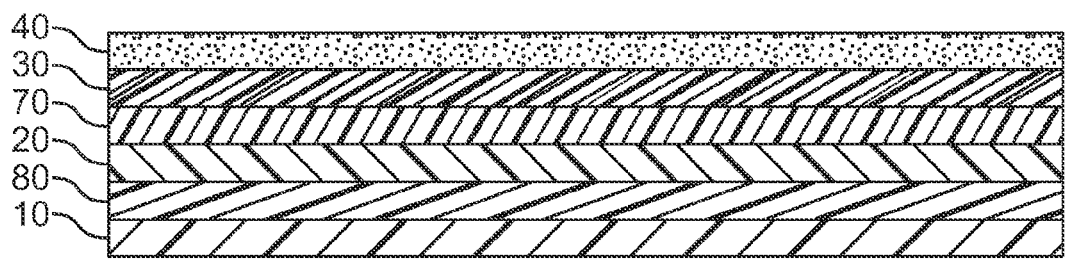
FIG. 7 is a cross-sectional view of a decorative tape according to the other exemplary embodiment of the present disclosure.

FIG. 7 illustrates a decorative tape according to yet another exemplary embodiment of the present disclosure.

The decorative tape includes a printing layer 10, a first hard coating layer 80 on the printing layer 10, a base film layer 20 on the first hard coating layer 80, a second hard coating layer 70 on the base film layer 20, a nickel deposited layer 30 on the second hard coating layer 70 and a pressure-sensitive adhesive layer 40 on the nickel deposited layer 30.

In the decorative tape, two types of hard coatings are performed.

When the hard coating layer is formed of two or more layers, one may be a layer having pencil hardness of 2 H or higher and the other may be a layer having pencil hardness of 3 H or higher.

Preferably, the hard coating layer 80 may be a 2 H hard coating layer and the second hard coating layer 70 may be a 3 H hard coating layer.

The 2 H hard coating layer 80 is also used for protecting the tape from scratches and improves printing. The 2 H hard coating layer 80 is treated in the opposite direction to that on which the nickel is deposited.

Figure 8:
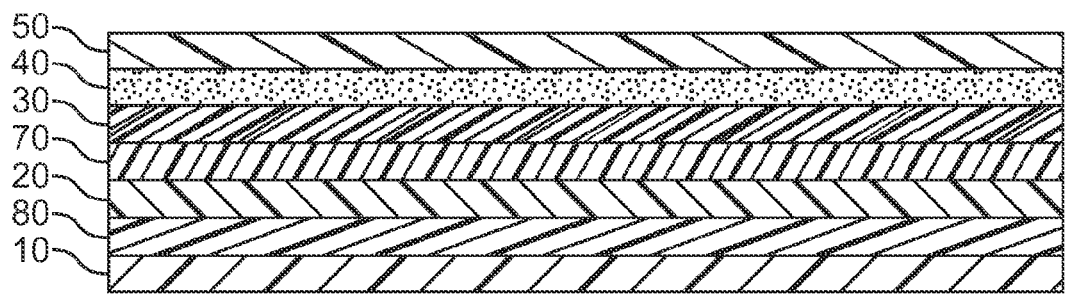
FIG. 8 is a cross-sectional view of a decorative tape including a releasing film formed on the tape of FIG. 7.

FIG. 8 is a cross-sectional view of the decorative tape including a releasing film 50 formed on the tape of FIG. 7. The releasing film 50 is peeled off in advance when attached to the substrate.

A method of manufacturing the decorative tape includes forming a second hard coating layer on a base film, depositing nickel on the second hard coating layer, forming a first hard coating layer on a backside of the base film, performing a coloring coating on the first hard coating layer, and laminating a pressure-sensitive adhesive on the nickel deposited surface.

The present disclosure may provide a roll-type sheet by forming the decorative tape printed as described above.

Figure 9:
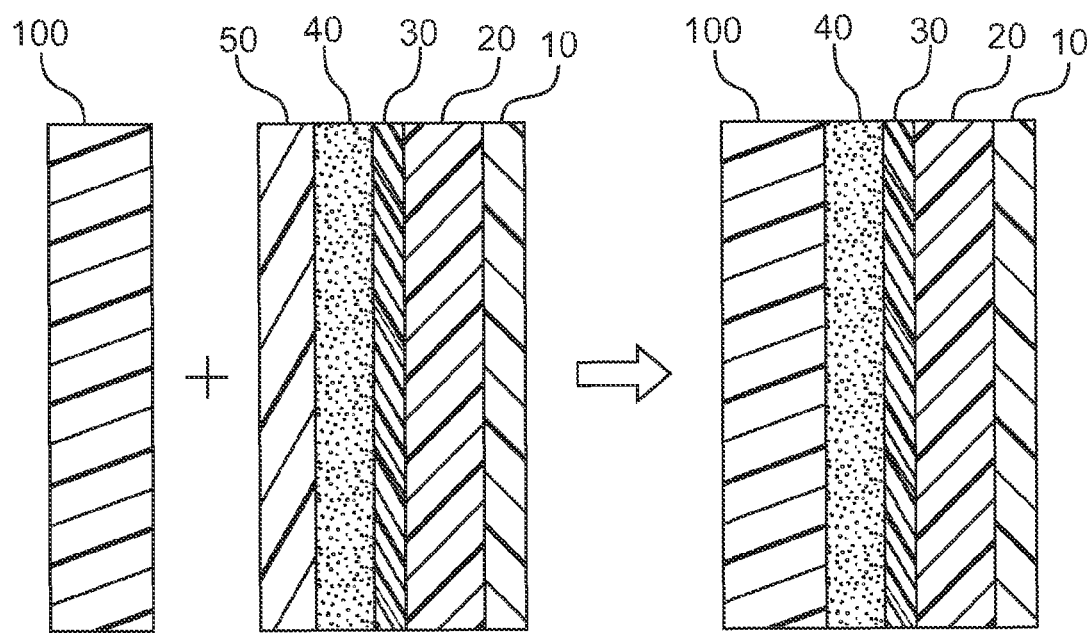
FIG. 9 illustrates a process of manufacturing a decorative cover by attaching the decorative tape of FIG. 4 to a substrate.

FIG. 9 illustrates a method of manufacturing a decorative cover according to the present disclosure. As illustrated in FIG. 9, the decorative cover according to the present disclosure is completed by peeling off only the releasing film 50 from the decorative tape according to the present disclosure and then simply attaching and laminating the decorative tape on a prepared substrate 100.

The decorative tape of the present disclosure may be attached inside the transparent substrate 100 to be used for the purpose of the decoration. The transparent substrate 100 may include polycarbonate, poly(methyl methacrylate) (PMMA), glass, and the like.

The decorative cover according to the present disclosure may mainly be used for home appliances, such as a refrigerator and an air conditioner, but may be widely used in other fields.

EXAMPLE 1

Nickel was deposited on one surface of a polyester film, which is a base, so as to have 5% of transmittance. A specific color was printed on a backside of the film. Next, a pressure-sensitive adhesive coated on a releasing paper was laminated on the nickel deposited surface, to manufacture sample 1.

EXAMPLE 2

In the same manner as in sample 1 except that nickel was deposited so as to have 10% of transmittance, sample 2 was manufactured.

EXAMPLE 3

In the same manner as in sample 1 except that nickel was deposited so as to have 13% of transmittance, sample 3 was manufactured.

EXAMPLE 4

In the same manner as in sample 1 except that nickel was deposited so as to have 15% of transmittance, sample 4 was manufactured.

EXAMPLE 5

In the same manner as in sample 1 except that nickel was deposited so as to have 18% of transmittance, sample 5 was manufactured.

Table 1 as shown below represents measurement results of physical characteristics of the samples obtained in samples 1 to 5.

TABLE 1

| Test item | Result | Test method |
| --- | --- | --- |
| Thickness of base (deposition + base + printing) | 138 μm | ASTM D3652 |
| Thickness of adhesive | 30 μm | ASTM D3652 |
| Thickness of releasing film | 50 μm | ASTM D3652 |
| Adhesive force on glass | Higher than 800 gf/in | ASTM D3330 |

<Results—Optical Properties>

Table 2 as shown below represents analysis results of optical properties of the samples obtained in Examples 1 to 5 by using a spectrophotometer. Table 2 represents result values of final products wherein the nickel deposition, the printed surface that is the opposite surface of the nickel deposited surface, and the pressure-sensitive adhesive are comprised.

TABLE 2

|  | Reflectivity (%) | Transmittance (%) | Haze (%) |
| --- | --- | --- | --- |
| Sample 1 | 34.92 | 1.80 | 84.80 |
| Sample 2 | 31.41 | 2.41 | 84.52 |
| Sample 3 | 29.48 | 2.46 | 90.90 |
| Sample 4 | 27.81 | 2.86 | 91.62 |
| Sample 5 | 19.66 | 5.04 | 91.54 |

The results represented in the table match a theory that the reflectivity is inversely proportional to the transmittance.

<Results—Color Characteristics>

Fine differences in colors for the five samples were identified by using a spectrophotometer, and the identified results are represented in Table 3 as shown below. In Table 3, "L" represents brightness, "a" represents a red index, and "b" represents a yellow index.

TABLE 3

|  | L | a | B |
| --- | --- | --- | --- |
| Sample 1 | 65.97 | 0.73 | 3.05 |
| Sample 2 | 63.03 | 0.91 | 3.17 |
| Sample 3 | 61.24 | 1.53 | 3.24 |
| Sample 4 | 58.00 | 1.58 | 3.63 |
| Sample 5 | 51.05 | 4.37 | 3.93 |

All of the Samples 1 to 5 represented almost the same color, but represented fine differences. The fine differences result from reflectivity differences. Brightness "L" becomes decreased as the reflectivity decreases.

EXAMPLES 6 AND 7 AND COMPARATIVE EXAMPLES 1-3

Example 6 is a film in which the PET base film layer 20 is formed on the primer layer 60 and the 3 H hard coating layer 70 is formed on the base film layer 20 as illustrated in FIG. 5. When observing the dispersion of light, haze and scratches, the film showed that all the characteristics are excellent. The film also showed an excellent protection effect against scratch without haze by the 3 H hard coating.

Example 7 is a film including the first hard coating layer (2 H hard coating layer) 80, the PET base film layer 20 formed on the first hard coating layer 80, the second hard coating layer (3 H hard coating layer) 70 formed on the base film layer 20 as illustrated in FIG. 7. It was shown that the 3 H hard coating surface has a relatively worse property than that of the 2 H hard coating surface, but has better transparency than that of the 2 H hard coating surface. The 2 H hard coating surface is processed on an opposite surface of the deposited surface. Because it is impossible to recognize soft haze in the opposite surface, the hard coating is not needed. However, the 2 H hard coating surface is more appropriate to be printed on the film. A 2 H hard coating material is used to more improve adhesion between the film and the printing ink. The film also showed the excellent characteristic, such as dispersion of light, haze and scratches.

Comparative Examples 1, 2 and 3 are films in which the PET base film layer is formed thereon and a corona or primer layer is formed on the PET base film layer. Problems, such as the dispersion of light (Comparative Example 1), haze due to the primer (Comparative Example 2) and generation of scratches (Comparative Example 3), were observed in the films. Experimental Results of dispersion, haze and scratch characteristics are shown in below Table 4.

TABLE 4

|  | Film class | Thickness | Structure | Result |
| --- | --- | --- | --- | --- |
| Example 6 | Optical | 125 | HC(3H)/PET/Primer | Excellent |
| Example 7 | Optical | 188 | HC(3H)/PET/HC(2H)/Liner | Excellent |
| Comparative Example 1 | Non-optical | 100 | Corona/PET/Primer | Light is dispersed. |
| Comparative Example 2 | Optical | 125 | Primer/PET/Primer | Haze is generated. |
| Comparative Example 3 | Optical | 125 | Corona/PET/Primer | Scratch is generated. |

As a result of the experiment, as described above, it was shown that the films according to Examples 6 and 7 had excellent dispersion, haze and scratch characteristics, compared to the films according to Comparative Examples 1, 2 and 3.

DRAWING REFERENCE NUMBERS

10: Printing layer
20: Base film layer
30: Nickel deposited layer
40: Pressure-sensitive adhesive layer
50: Releasing film
60: Primer layer
70: Hard coating layer or $2^{nd}$ hard coating layer
80: $1^{st}$ hard coating layer
100: Substrate

What is claimed is:

1. A decorative cover for an appliance, comprising:
a transparent substrate on the exterior of the appliance, the transparent substrate having an inside and outside surface;
a decorative tape, adhered to the transparent substrate inside surface, comprising, in the following order:

a pressure-sensitive adhesive layer;
a nickel deposited layer providing at least 5% light transmittance;
a transparent base film layer; and,
a colored coating layer.

2. The decorative tape of claim 1, wherein the nickel-deposited layer allows no greater than 18% light transmittance.

3. The decorative tape of claim 2, wherein the transparent base film layer is formed of a polyester film.

4. The decorative tape of claim 3, wherein the polyester film is polyethylene terephthalate.

5. The decorative tape of claim 2, wherein the colored coating is a continuous colored coating.

6. The decorative tape of claim 1, wherein the transparent base film layer is formed of a polyester film.

7. The decorative tape of claim 6, wherein the polyester film is polyethylene terephthalate.

8. The decorative tape of claim 1, wherein the pressure-sensitive adhesive layer has a thickness in a range of 10 to 50 μm.

9. The decorative tape of claim 8, wherein the pressure-sensitive adhesive layer has a thickness in a range of 15 to 30 μm.

10. A method of manufacturing the decorative tape of claim 1, the method comprising:
depositing nickel on a base film;
performing a coloring coating on a backside of the base film; and
laminating a pressure-sensitive adhesive on the nickel deposited surface.

\* \* \* \* \*